(12) United States Patent
Long

(10) Patent No.: US 11,296,074 B2
(45) Date of Patent: Apr. 5, 2022

(54) ELECTROSTATIC PROTECTION CIRCUIT AND MANUFACTURING METHOD THEREOF, ARRAY SUBSTRATE AND DISPLAY APPARATUS

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 14 days.

(21) Appl. No.: 16/638,968

(22) PCT Filed: Jun. 19, 2019

(86) PCT No.: PCT/CN2019/091913
§ 371 (c)(1),
(2) Date: Feb. 13, 2020

(87) PCT Pub. No.: WO2020/019908
PCT Pub. Date: Jan. 30, 2020

(65) Prior Publication Data
US 2020/0194425 A1 Jun. 18, 2020

(30) Foreign Application Priority Data
Jul. 25, 2018 (CN) .......................... 201821189406.9

(51) Int. Cl.
*H01L 27/02* (2006.01)
*G09G 3/20* (2006.01)

(52) U.S. Cl.
CPC .......... *H01L 27/0292* (2013.01); *G09G 3/20* (2013.01); *G09G 2330/04* (2013.01)

(58) Field of Classification Search
CPC ... H01L 27/0292; G09G 3/20; G09G 2330/04
(Continued)

(56) References Cited

U.S. PATENT DOCUMENTS

2004/0188682 A1 9/2004 Hirai et al.
2005/0062047 A1* 3/2005 Nishikawa .......... H01L 27/1281
257/72

(Continued)

FOREIGN PATENT DOCUMENTS

CN 202183003 U 4/2012
CN 105655357 A 6/2016
(Continued)

*Primary Examiner* — Thienvu V Tran
*Assistant Examiner* — Sreeya Sreevatsa
(74) *Attorney, Agent, or Firm* — Fay Sharpe LLP

(57) ABSTRACT

An electrostatic protection circuit and a manufacturing method, an array substrate and a display apparatus in field of display technologies are provided. The electrostatic protection includes a first thin film transistor, a second thin film transistor, and an electrostatic protection line; a gate and a second electrode of the first thin film transistor are connected to a signal line, and a first electrode of the first thin film transistor is connected to the electrostatic protection line; a gate and a second electrode of the second thin film transistor are connected to the electrostatic protection line, and a first electrode of the second thin film transistor is connected to the signal line; each thin film transistor is an oxide thin film transistor, a length-width ratio of a channel of each thin film transistor is greater than or equal to a length-width ratio threshold, the length-width ratio threshold being 5.

16 Claims, 16 Drawing Sheets

(58) Field of Classification Search
USPC .......................................................... 361/56
See application file for complete search history.

(56) References Cited

U.S. PATENT DOCUMENTS

| | | | |
|---|---|---|---|
| 2012/0064643 A1* | 3/2012 | Bawolek | G09G 3/006 |
| | | | 438/16 |
| 2015/0255449 A1* | 9/2015 | Kim | G09G 3/3648 |
| | | | 349/40 |
| 2018/0204829 A1* | 7/2018 | Cheng | H01L 27/0296 |

FOREIGN PATENT DOCUMENTS

| | | |
|---|---|---|
| CN | 205450520 U | 8/2016 |
| CN | 205810810 U | 12/2016 |
| CN | 208507683 U | 2/2019 |

* cited by examiner

Optional shapes of the channel

ELECTROSTATIC PROTECTION CIRCUIT AND MANUFACTURING METHOD THEREOF, ARRAY SUBSTRATE AND DISPLAY APPARATUS

This application is a 371 of PCT International Application No. PCT/CN2019/091913, filed on Jun. 19, 2019, which claims priority to Chinese Patent Application No. 201821189406.9, filed on Jul. 25, 2018 and entitled "ELECTROSTATIC PROTECTION CIRCUIT, ARRAY SUBSTRATE AND DISPLAY APPARATUS", the entire contents of which are incorporated herein by reference.

TECHNICAL FIELD

The present disclosure relates to the field of display technologies, and in particular, to an electrostatic protection circuit and a manufacturing method thereof, an array substrate and a display apparatus.

BACKGROUND

In the manufacturing process of an array substrate, it is easy to generate static electricity due to processes such as plasma deposition, film layer etching, and friction, and thus signal lines formed on the array substrate may undergo electrostatic breakdown and electrostatic damage, resulting in the defective array substrate. To ensure normal operation of various signal lines, an electrostatic protection device connected to the signal line is disposed on the array substrate. The electrostatic protection device is also known as an electrostatic discharge (ESD) device.

The electrostatic protection device in the related art generally includes a thin film transistor and an electrostatic protection line. The source of the thin film transistor may be connected to the signal line, and the gate and the drain thereof may be connected to the electrostatic protection line. The thin film transistor can punctually release the static electricity generated on the signal line to the electrostatic protection line.

SUMMARY

The present disclosure provides an electrostatic protection circuit and a manufacturing method thereof, an array substrate and a display apparatus. The technical solutions are as follows:

in an aspect, an electrostatic protection circuit is provided. The electrostatic protection circuit comprises a first thin film transistor, a second thin film transistor and an electrostatic protection line, wherein a gate and a second electrode of the first thin film transistor are connected to a signal line, and a first electrode of the first thin film transistor is connected to the electrostatic protection line; and a gate and a second electrode of the second thin film transistor are connected to the electrostatic protection line, and a first electrode of the second thin film transistor is connected to the signal line;

wherein each thin film transistor is an oxide thin film transistor, a length-width ratio of a channel of each thin film transistor is greater than or equal to a length-width ratio threshold, and the length-width ratio threshold is 5.

Optionally, a length direction of the channel of each thin film transistor is parallel to an extension direction of the signal line.

Optionally, the gate of each thin film transistor is of a strip-shaped structure and a length direction of the strip-shaped structure is parallel to an extension direction of the signal line.

Optionally, an arrangement direction of the first thin film transistor and the second thin film transistor is parallel to an extension direction of the signal line.

Optionally, the signal line is a data line extending along a first direction; the electrostatic protection line comprises: a first discharge line and a second discharge line which extend along a second direction and are parallel to each other, and a connection line for connecting the first discharge line and the second discharge line; the first direction intersecting the second direction; and the first thin film transistor and the second thin film transistor are disposed between the first discharge line and the second discharge line, the first electrode of the first thin film transistor is connected to the first discharge line, and the gate and the second electrode of the second thin film transistor are connected to the second discharge line.

Optionally, the second electrode of the first thin film transistor and the first electrode of the second thin film transistor are of an integral structure, and the gate of the first thin film transistor is connected to the integral structure through a via.

Optionally, the signal line is a gate line extending along a second direction; and the electrostatic protection line extends along a first direction, and the second direction intersects the first direction.

Optionally, the electrostatic protection circuit further comprises: a third thin film transistor and a fourth thin film transistor; wherein a gate and a second electrode of the third thin film transistor are connected to the first electrode of the first thin film transistor and a first electrode of the third thin film transistor is connected to the electrostatic protection line; a gate and a second electrode of the fourth thin film transistor are connected to the first electrode of the first thin film transistor and a first electrode of the fourth thin film transistor is connected to the signal line; and the first thin film transistor and the second thin film transistor are arranged along a first axis, the third thin film transistor and the fourth thin film transistor are arranged along a second axis, and the first axis and the second axis intersect the first direction and are not collinear.

Optionally, the first axis and the second axis are parallel to the second direction.

Optionally, the first electrode of the first thin film transistor, the first electrode of the second thin film transistor, the second electrode of the third thin film transistor and the second electrode of the fourth thin film transistor are of an integral structure; and the gate of the third thin film transistor and the gate of the fourth thin film transistor are connected to the integral structure through vias.

Optionally, the gate of the third thin film transistor and the gate of the fourth thin film are of an integral structure.

Optionally, the second direction is perpendicular to the first direction.

Optionally, the electrostatic protection circuit further comprises: at least one of a third thin film transistor and a fourth thin film transistor; wherein a gate and a second electrode of the third thin film transistor are connected to the first electrode of the first thin film transistor and a first electrode of the third thin film transistor is connected to the electrostatic protection line; and a gate and a second electrode of the fourth thin film transistor are connected to the first electrode of the first thin film transistor and a first electrode of the fourth thin film transistor is connected to the signal line.

Optionally, the channel of each thin film transistor is S-shaped, zigzag or arc-shaped.

In another aspect, an array substrate is provided. The array substrate comprises:

a signal line, and the electrostatic protection circuit according to any of claims 1-15 connected to the signal line.

Optionally, the signal line is a data line extending along a first direction, and the array substrate comprises a plurality of data lines; the electrostatic protection line comprises: three discharge lines which extend along a second direction and are parallel to one another, and a connection line for connecting the three discharge lines; the second direction intersecting the first direction;

an electrostatic protection circuit connected to each data line and an electrostatic protection circuit connected to an adjacent data line are in the same column;

in the two electrostatic protection circuits in the same column, one electrostatic protection circuit is between a first discharge line and a second discharge line among the three discharge lines, and the other electrostatic protection circuit is between the second discharge line and a third discharge line among the three discharge lines; and gates and second electrodes of second thin film transistors in the two electrostatic protection circuits in the same column are connected to the second discharge line.

Optionally, the signal line is a gate line extending along a second direction and the array substrate comprises a plurality of gate lines; the electrostatic protection line extends along a first direction, and the second direction is perpendicular to the first direction; and an electrostatic protection circuit connected to one of each two adjacent gate lines of the plurality of gate lines is disposed between the two adjacent gate lines.

In yet another aspect, a display apparatus is provided. The display apparatus comprises the array substrate described in the above aspect.

In still yet another aspect, a method for manufacturing an electrostatic protection circuit is provided. The method comprises:

providing a base substrate; and forming a first thin film transistor, a second thin film transistor and an electrostatic protection line on the base substrate;

wherein, a gate and a second electrode of the first thin film transistor are connected to a signal line, and a first electrode of the first thin film transistor is connected to the electrostatic protection line; and a gate and a second electrode of the second thin film transistor are connected to the electrostatic protection line, and a first electrode of the second thin film transistor is connected to the signal line; each thin film transistor is an oxide thin film transistor, a length-width ratio of a channel of each thin film transistor is greater than or equal to a length-width ratio threshold, and the length-width ratio threshold is 5.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

Transistors used in embodiments of the present disclosure may all be thin film transistors, and mainly are switching transistors according to their functions in a circuit. Since the source and the drain of the switching transistor used here are symmetrical, the source and the drain of the switching transistor are interchangeable. In the embodiments of the present disclosure, the source may be referred to as a first electrode and the drain may be referred to as a second electrode, or the source may be referred to as a second electrode and the drain may be referred to as a first electrode. According to the form in the accompanying drawings, it's specified that an intermediate terminal of the transistor is the gate, a signal input terminal is the source, and a signal output terminal is the drain.

Figure 1:
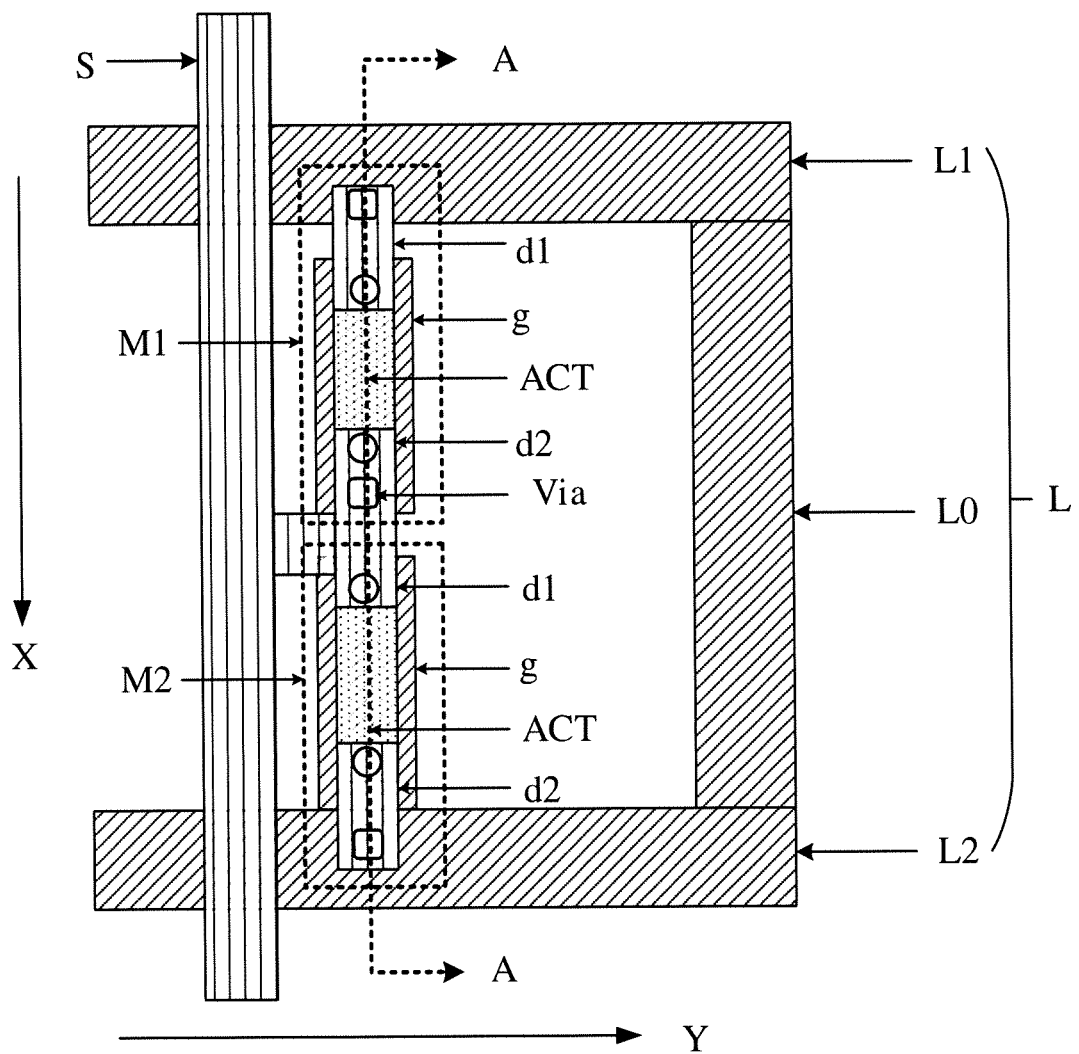
FIG. 1 is a schematic structural diagram of an electrostatic protection circuit according to an embodiment of the present disclosure.
Figure 2:
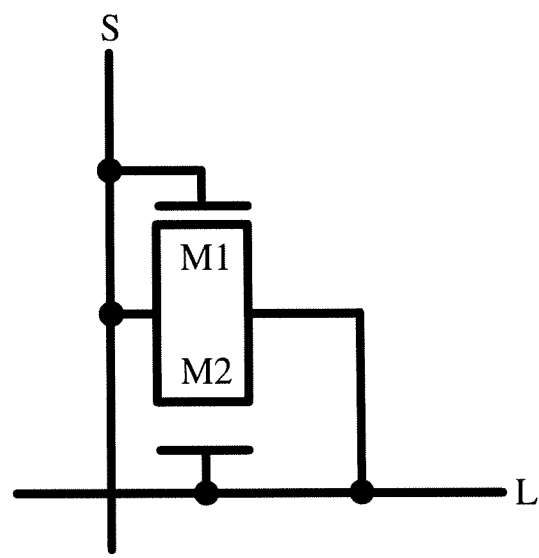
FIG. 2 is an equivalent circuit diagram of an electrostatic protection circuit according to an embodiment of the present disclosure.

FIG. 1 is a schematic structural diagram of an electrostatic protection circuit according to an embodiment of the present disclosure; and FIG. 2 is an equivalent circuit diagram of an electrostatic protection circuit according to an embodiment of the present disclosure. With reference to FIGS. 1 and 2, the electrostatic protection circuit may include a first thin film transistor M1, a second thin film transistor M2, and an electrostatic protection line L.

A gate g and a second electrode d2 of the first thin film transistor M1 may be connected to a signal line S, and a first electrode d1 of the first thin film transistor M1 is connected to the electrostatic protection line L. For example, the first electrode d1 of the first thin film transistor M1 may be directly connected to the electrostatic protection line L.

A gate g and a second electrode d2 of the second thin film transistor M2 are connected to the electrostatic protection line L, and a first electrode d1 of the second thin film transistor M2 is connected to the signal line S. For example, the first electrode d1 of the second thin film transistor M2 may be directly connected to the signal line S.

Each thin film transistor may be an oxide thin film transistor. That is, the active layer of the thin film transistor is made of an oxide material, such as indium gallium zinc oxide (IGZO) or zinc oxide (ZnO). A length-width ratio of a channel ACT (i.e., active layer) of each thin film transistor is greater than or equal to a length-width ratio threshold, and the length-width ratio threshold may be greater than 1.

In summary, the embodiments of the present disclosure provide an electrostatic protection circuit. The thin film transistors included in the electrostatic protection circuit are oxide thin film transistors, and the length-width ratio of the channel of each thin film transistor is greater than or equal to the length-width ratio threshold, and the length-width ratio threshold is greater than 1. Thus, the on-state current of the transistors can be effectively reduced and thus the transistors are prevented from being burned out when a transient high voltage is generated in the signal line.

In the embodiments of the present disclosure, the length-width ratio threshold may be 5. That is, the width-length ratio W/L of the channel of each thin film transistor is less than or equal to 0.2.

Compared with a low-temperature poly-silicon (LTPS) thin film transistor, the oxide thin film transistor has a relatively simpler manufacturing process. Therefore, the electrostatic protection circuit is generally manufactured by using the oxide thin film transistor at present. However, the oxide thin film transistor has a relatively higher on-state current that is approximately five times of that of the LTPS thin film transistor. As the oxide thin film transistor has a relatively higher conductive capability and higher on-state current, the oxide thin film transistor is burned out easily when static electricity generated on the signal line has a relatively higher voltage.

It can be seen from the calculation formula $$I = \mu C_{ox} \frac{W}{L}\left[(V_{GS} - V_{TH})V_{DS} - \frac{1}{2}V_{DS}^2\right]$$

of the on-state current I of the thin film transistor that the magnitude of the on-state current is positively correlated with the width-length ratio W/L of the thin film transistor. In the above formula, $V_{GS}$ denotes a gate-source voltage of the thin film transistor, VTH denotes a threshold voltage of the thin film transistor, and $V_{DS}$ denotes a source-drain voltage of the thin film transistor.

Figure 3:
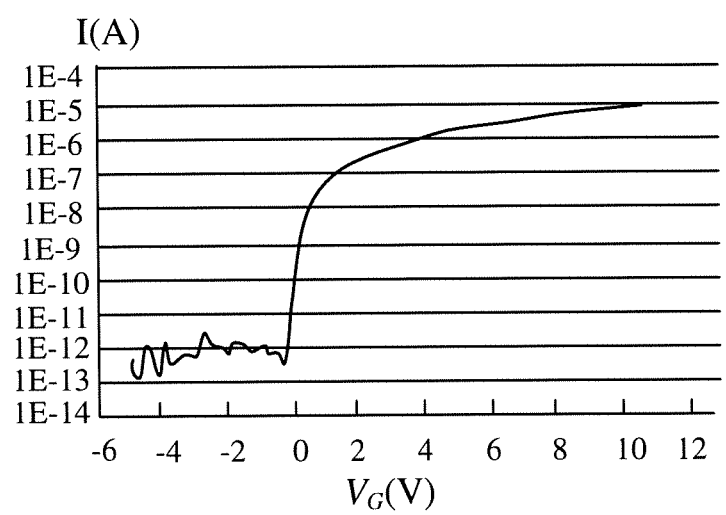
FIG. 3 is a diagram of change of an on-state current with a gate voltage of a thin film transistor according to an embodiment of the present disclosure.

FIG. 3 is a schematic diagram of change of an on-state current with a gate potential of a thin film transistor according to an embodiment of the present disclosure. FIG. 3 is illustrated by taking an example in which the width-length ratio W/L of the channel of the thin film transistor is 1 and the source-drain voltage $V_{DS}$ is 15V. It can be seen from FIG. 3 that when the gate potential $V_G$ of the thin film transistor reaches 10 V, the on-state current of the thin film transistor can reach $10^{-5}$ A. However, if the width-length ratio W/L of the channel of the thin film transistor is designed to be equal to or less than 0.2, the on-state current of the thin film transistor can reach $10^{-5}$ A when the gate potential $V_G$ of the thin film transistor reaches 50 V. Again, the static electricity generated on the signal line usually has a voltage less than 50 V. Therefore, the safe and efficient operation of the thin film transistor may be ensured by designing the W/L of the channel of the thin film transistor to be equal to or less than 0.2 (namely, the length-width ratio is greater than or equal to 5).

Optionally, it can further be seen from FIG. 1 that a length direction of the channel ACT of each thin film transistor may be parallel to an extension direction of the signal line S. In the embodiments of the present disclosure, since the channel of each transistor is relatively longer, the space occupied by the electrostatic protection circuit can be effectively reduced by making the length direction of the channel parallel to the extension direction of the signal line.

In the embodiments of the present disclosure, the signal line S may be any signal line on an array substrate. For example, the signal line S may be any signal line configured to drive a display apparatus, such as a data line, a gate line, or a clock signal line of a gate drive circuit. Alternatively, the signal line may also be a testing line or a maintenance line in the array substrate. The electrostatic protection line L may be a discharge line configured to provide a reference power supply signal. For example, the electrostatic protection line L may be a common electrode (Vcom) line configured to provide a common electrode signal with the potential of 0 V or approximately 0 V. When static electricity is generated on the signal line S, the first thin film transistor M1 or the second thin film transistor M2 may be turned on, so that the signal line S is communicated with the electrostatic protection line L. Thus, the static electricity generated on the signal line S can be punctually released to the electrostatic protection line L.

Figure 4:
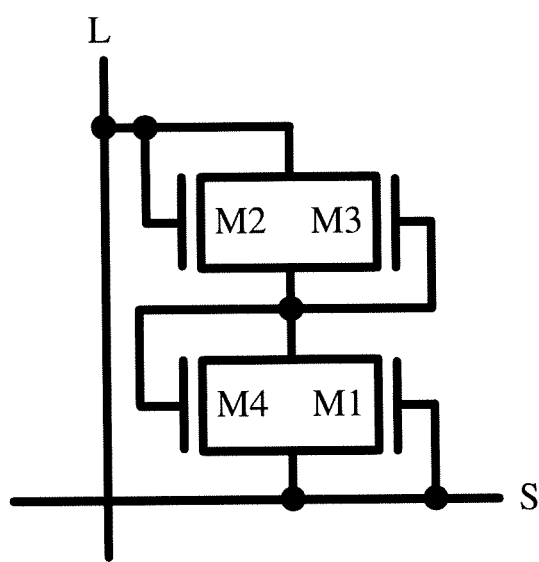
FIG. 4 is an equivalent circuit diagram of an another electrostatic protection circuit according to an embodiment of the present disclosure.

Optionally, the electrostatic protection circuit according to the embodiments of the present disclosure may further include at least one of a third thin film transistor M3 and a fourth thin film transistor M4. Exemplarily, FIG. 4 is an equivalent circuit diagram of an another electrostatic protection circuit according to an embodiment of the present disclosure. As shown in FIG. 4, the electrostatic protection circuit further includes a third thin film transistor M3 and a fourth thin film transistor M4.

With reference to FIG. 4, a gate and a second electrode of the third thin film transistor M3 may be connected to the first electrode of the first thin film transistor M1, and a first electrode of the third thin film transistor M3 is connected to the electrostatic protection line L. A gate and a second electrode of the fourth thin film transistor M4 are connected to the first electrode of the first thin film transistor M1, and a first electrode of the fourth thin film transistor M4 is connected to the signal line S.

In the circuit structure shown in FIG. 4, the first electrode of the first thin film transistor M1 may be connected to the electrostatic protection line L through the third thin film transistor M3. The first electrode of the second thin film transistor M2 may be connected to the signal line S through the fourth thin film transistor M4. Whereas in the circuit structure shown in FIGS. 1 and 2, the first electrode of the first thin film transistor M1 is directly connected to the electrostatic protection line L, and the first electrode of the second thin film transistor M2 is directly connected to the signal line S.

Resistance between the first electrode of the first thin film transistor M1 and the electrostatic protection line L can be increased by disposing the third thin film transistor M3, so that the magnitude of the current flowing through the first thin film transistor M1 may be effectively reduced, thereby preventing the first thin film transistor M1 from being burned out. Similarly, resistance between the first electrode of the second thin film transistor M2 and the signal line S can be increased by disposing the fourth thin film transistor M4, so that the magnitude of the current flowing through the second thin film transistor M2 can be effectively reduced, thereby preventing the second thin film transistor M2 from being burned out.

Optionally, as shown in FIG. 1, the gate g of each thin film transistor in the electrostatic protection circuit may be of a strip-shaped structure, and a length direction of the strip-shaped structure is parallel to an extension direction of the signal line S. Thus, the space occupied by the thin film transistor can be reduced.

With reference to FIG. 1, it can further be seen that an arrangement direction of the first thin film transistor M1 and the second thin film transistor M2 may also be parallel to the extension direction of the signal line S, so as to minimize the space occupied by the electrostatic protection circuit.

As an optional implementation, with reference to FIG. 1, the signal line S may be a data line extending along a first direction X. The electrostatic protection line L may include: a first discharge line L1 and a second discharge line L2 which extend along a second direction Y and are parallel to each other, and a connection line L0 for connecting the first discharge line L1 with the second discharge line L2. The second direction Y may intersect the first direction X.

Optionally, the connection line L0 may extend along the first direction X. The second direction Y may be perpendicular to the first direction X.

Figure 5:
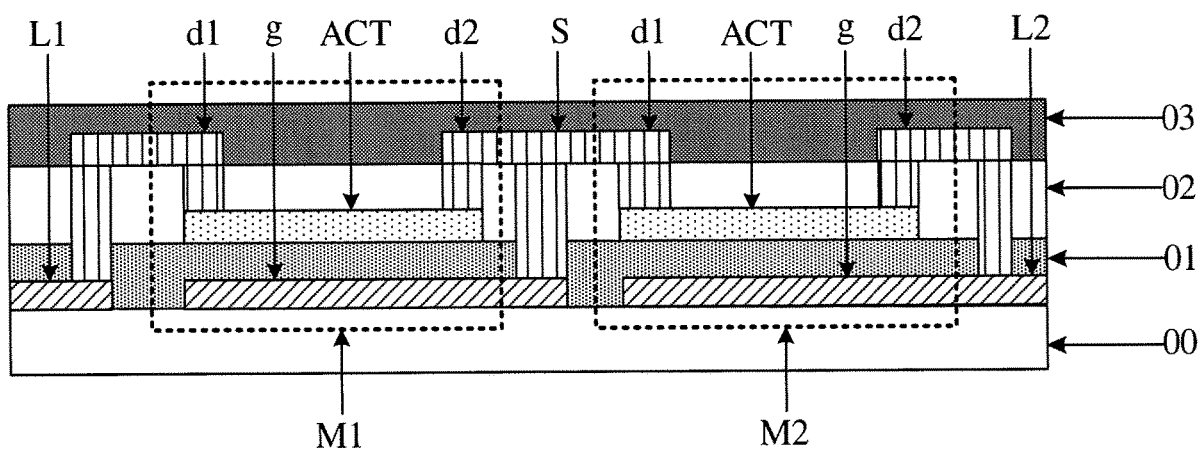
FIG. 5 is a sectional view of FIG. 1 along the direction AA.

FIG. 5 is a sectional view of FIG. 1 along the direction AA. In conjunction with FIGS. 1 and 5, it can be seen that the first thin film transistor M1 and the second thin film transistor M2 may be both disposed between the first discharge line L1 and the second discharge line L2. In addition, the first electrode d1 of the first thin film transistor M1 may be connected to the first discharge line L1, and the gate g and the second electrode d2 of the second thin film transistor M2 may be connected to the second discharge line L2.

Exemplarily, as shown in FIG. 5, when the signal line S is the data line, the first electrode d1 and the second electrode d2 of each thin film transistor may be disposed on the same layer as the signal line S, and the gate g of each thin film transistor may be disposed on the same layer as the electrostatic protection line L. Therefore, in conjunction with FIGS. 1 and 5, it can be seen that the first electrode d1 of the first thin film transistor M1 may be connected to the first discharge line L1 through a via. The second electrode d2 of the second thin film transistor M2 may be connected to the second discharge line L2 through a via. The gate g of the second thin film transistor M2 may be directly connected to the second discharge line L2. For example, as shown in FIG. 5, the gate g of the second thin film transistor M2 and the second discharge line L2 may adopt an integral structure.

Since data lines are generally narrowly spaced in the array substrate, the space occupied by the electrostatic protection circuit can be effectively reduced by disposing two parallel discharge lines and connecting each thin film transistor to one discharge line, thereby achieving reasonable wiring.

Optionally, as shown in FIGS. 1 and 5, the second electrode d2 of the first thin film transistor M1 and the first electrode d1 of the second thin film transistor M2 may adopt an integral structure that may be directly connected to the signal line S. That is, the second electrode d2 of the first thin film transistor M1, the first electrode d1 of the second thin film transistor M2 and the signal line S may be formed through a one-time patterning process. The gate g of the first thin film transistor M1 may be connected to the integral structure through a via (such as a square via in FIG. 1).

By designing the electrodes, connected to the signal line S, in the two thin film transistors as an integral structure, the space occupied by the electrostatic protection circuit can be reduced and the manufacturing process of the electrostatic protection circuit can be simplified.

Figure 6:
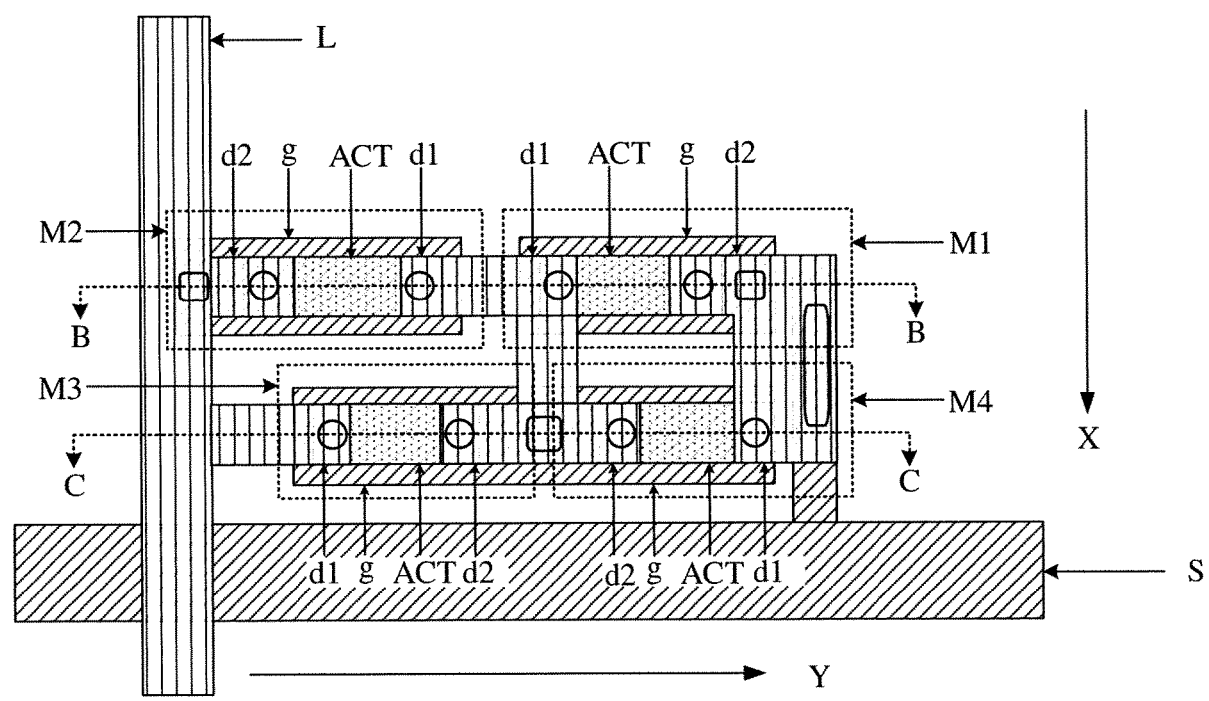
FIG. 6 is a schematic structural diagram of another electrostatic protection circuit according to an embodiment of the present disclosure.

As another optional implementation, as shown in FIG. 6, the signal line S may also be a gate line extending along a second direction Y, the electrostatic protection line L may extend along the first direction X, and the second direction Y intersects the first direction X. For example, the second direction Y is perpendicular to the first direction X.

With continued reference to FIG. 6, the electrostatic protection circuit may further include a third thin film transistor M3 and a fourth thin film transistor M4. A gate g and a second electrode d2 of the third thin film transistor M3 may be connected to the first electrode d1 of the first thin film transistor M1, and a first electrode d1 of the third thin film transistor M3 may be connected to the electrostatic protection line L. A gate g and a second electrode d2 of the fourth thin film transistor M4 may be connected to the first electrode d1 of the first thin film transistor M1, and a first electrode d1 of the fourth thin film transistor M4 may be connected to the signal line S.

As shown in FIG. 6, the first thin film transistor M1 and the second thin film transistor M2 may be arranged along a first axis. The third thin film transistor M3 and the fourth thin film transistor M4 may be arranged along a second axis. The first axis and the second axis intersect the first direction X and the two axes are not collinear. For example, the first axis and the second axis may be parallel to the second direction Y.

With reference to FIG. 6, it can be seen that the first electrode d1 of the first thin film transistor M1, the first electrode d1 of the second thin film transistor M2, the second electrode d2 of the third thin film transistor M3 and the second electrode d2 of the fourth thin film transistor M4 may adopt an integral structure. In addition, the gate g of the third thin film transistor M3 and the gate g of the fourth thin film transistor M4 may be connected to the integral structure through vias (such as square vias in FIG. 6) respectively.

Since the four thin film transistors are parallelly arranged in two rows, each of the four thin film transistors has one electrode close to the electrodes of the other thin film transistors. By designing the integral structure as an electrode shared by the four thin film transistors, the wiring space can be saved effectively, the space occupied by the electrostatic protection circuit can reduced and the manufacturing process thereof can be simplified.

Figure 7:
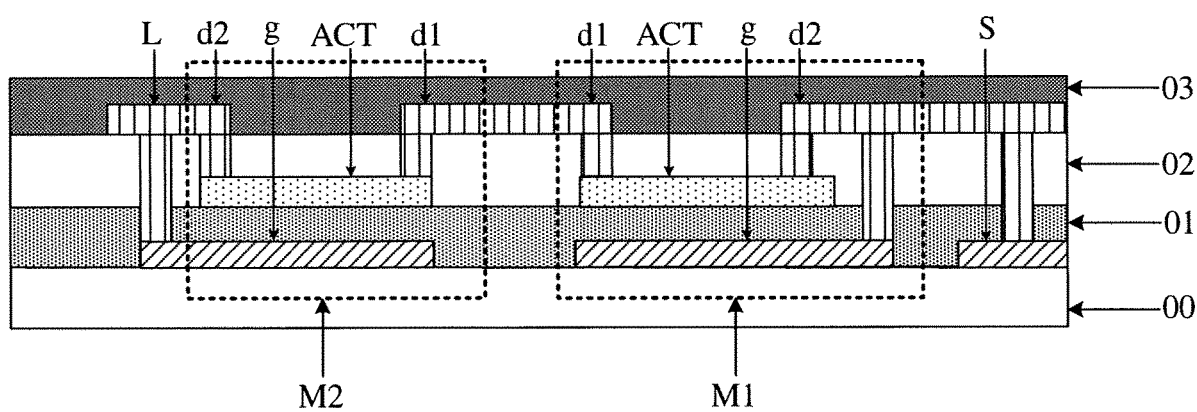
FIG. 7 is a sectional view of FIG. 6 along the direction BB.
Figure 8:
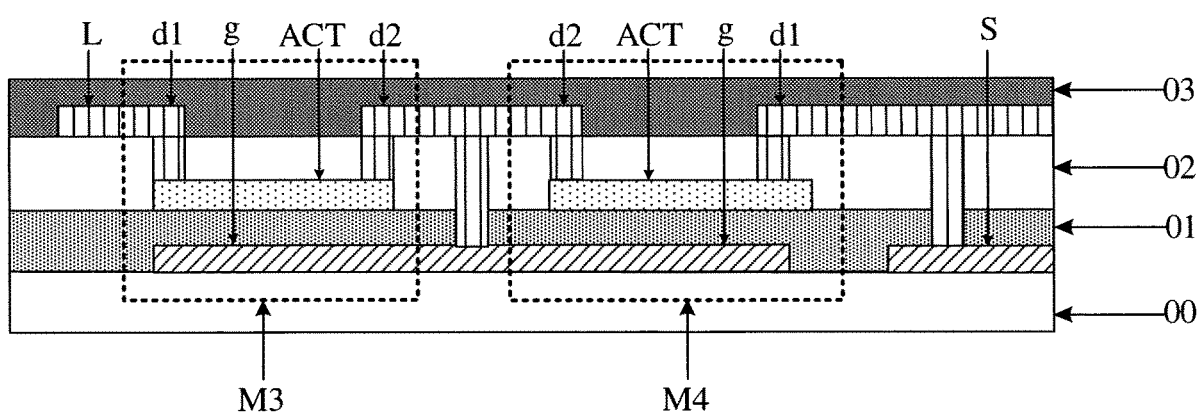
FIG. 8 is a sectional view of FIG. 6 along the direction CC.

FIG. 7 is a sectional view of FIG. 6 along the direction BB; and FIG. 8 is a sectional view of FIG. 6 along the direction CC. In conjunction with FIG. 6 to FIG. 8, it can be seen that when the signal line S is the gate line, the gates of various thin film transistors may be disposed on the same layer as the signal line S, and the first electrodes and the second electrodes of the various thin film transistors may be disposed on same layer as the electrostatic protection line L. Therefore, the gate g and the second electrode d2 of the first thin film transistor M1 as well as the first electrode d1 of the fourth thin film transistor M4 may be connected to the signal line S through vias, respectively.

The gate g of the second thin film transistor M2 may be connected to the electrostatic protection line L through a via, and the second electrode d2 of the second thin film transistor M2 and the first electrode d1 of the third thin film transistor M3 may be directly connected to the electrostatic protection line L. For example, as shown in FIGS. 6 and 7, the second electrode d2 of the second thin film transistor M2 and the electrostatic protection line L may adopt an integral structure. As shown in FIGS. 6 and 8, the first electrode d1 of the third thin film transistor M3 and the electrostatic protection line L may also adopt an integral structure.

Optionally, as shown in FIGS. 6 and 8, the gates g of the third thin film transistor M3 and the fourth thin film transistor M4 may adopt an integral structure. Thus, the manufacturing process can be simplified and the space occupied by the electrostatic protection circuit is further saved.

Figure 9:
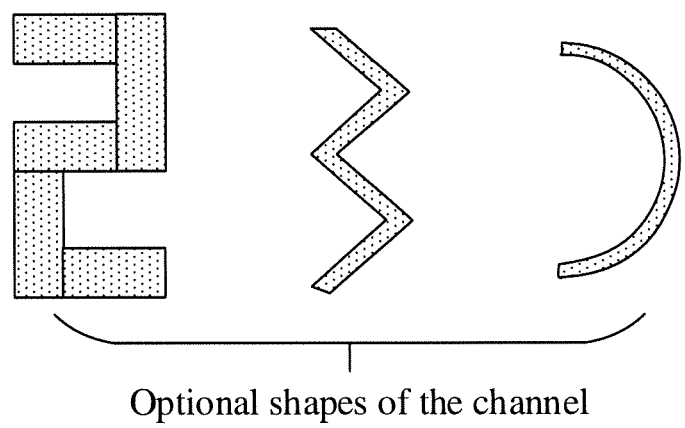
FIG. 9 is a schematic diagram of optional shapes of a channel according to an embodiment of the present disclosure.

FIG. 9 is a schematic diagram of optional shapes of a channel according to an embodiment of the present disclosure. With reference to FIG. 9, the channel ACT of each thin film transistor in the electrostatic protection circuit may be S-shaped, zigzag, arc-shaped and the like in addition to being rectangular. The length-width ratio of the channel can be increased as far as possible in a limited space by designing the S-shaped, zigzag or arc-shaped channel. The shape of the channel may refer to the shape of the orthographic projection of the channel on the base substrate.

With reference to FIGS. 5, 7 and 8, it can further be seen that the electrostatic protection circuit may be disposed on the base substrate 00. A gate insulation (GI) layer 01 is disposed on the side, away from the base substrate 00, of the gate g of the thin film transistor, and the active layer ACT of the thin film transistor may be disposed on the side, away from the base substrate 00, of the gate insulation layer 01. An etch stop layer (ESL) 02 is further disposed on the side, away from the base substrate 00, of the active layer ACT, and the first electrode d1 and the second electrode d2 of the thin film transistor may be disposed on the side, away from the base substrate 00, of the etch stop layer 02. A passivation (PVX) layer 03 may further be disposed on the side, away from the base substrate 00, of the first electrode d1 and the second electrode d2 of the thin film transistor.

The etch stop layer 02 may be made of a SiOx material. The gate insulation layer 01 may be made of an oxide insulation material, such as SiOx or $Al_2O_3$. The passivation layer 03 may be made of an insulation material, such as silicon nitride, silicon oxynitride, polyimide and acryl.

In summary, the embodiments of the present disclosure provide an electrostatic protection circuit. The thin film transistors included in the electrostatic protection circuit are the oxide thin film transistors, and the length-width ratio of the channel of each thin film transistor is greater than or equal to the length-width ratio threshold, and the length-width ratio threshold is greater than 1. Thus, the on-state current of the transistor can be effectively reduced and thus the transistor is prevented from being burned out when a transient high voltage is generated on the signal line. In addition, since the channel of each transistor is relatively longer, the space occupied by the electrostatic protection circuit may be effectively reduced by making the length direction of the channel parallel to the extension direction of the signal line.

Figure 10:
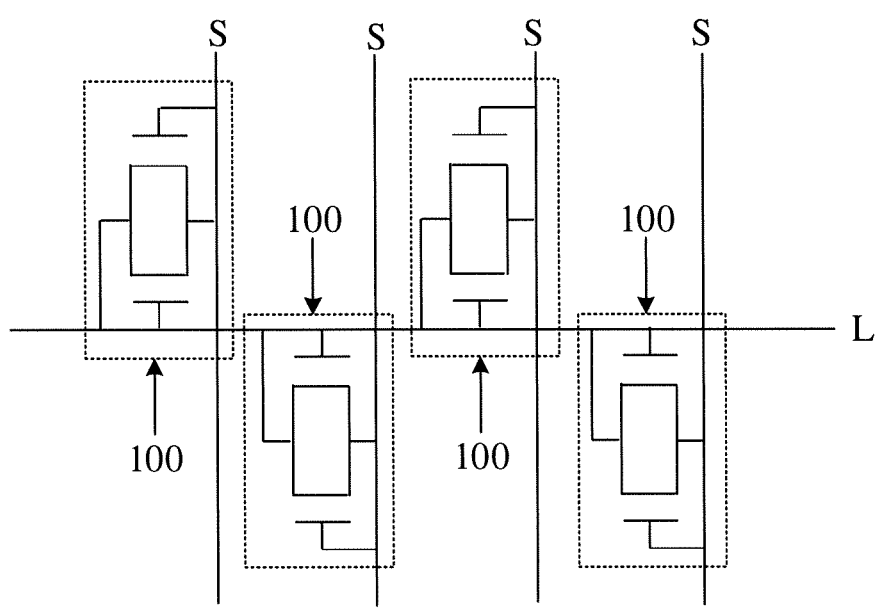
FIG. 10 is a schematic structural diagram of an array substrate according to an embodiment of the present disclosure.

FIG. 10 is a schematic structural diagram of an array substrate according to an embodiment of the present disclosure. With reference to FIG. 10, the array substrate may include a signal line S, and an electrostatic protection circuit 100 connected to the signal line S. The electrostatic protection circuit 100 may the circuit shown in any of FIGS. 1, 2 and 4-8.

Optionally, as shown in FIG. 10, the array substrate may include a plurality of signal lines S, each of which may be connected to one electrostatic protection circuit 100. In addition, the electrostatic protection circuits 100 connected to the signal lines S may all be located in the non-display region at the periphery of the array substrate.

Figure 11:
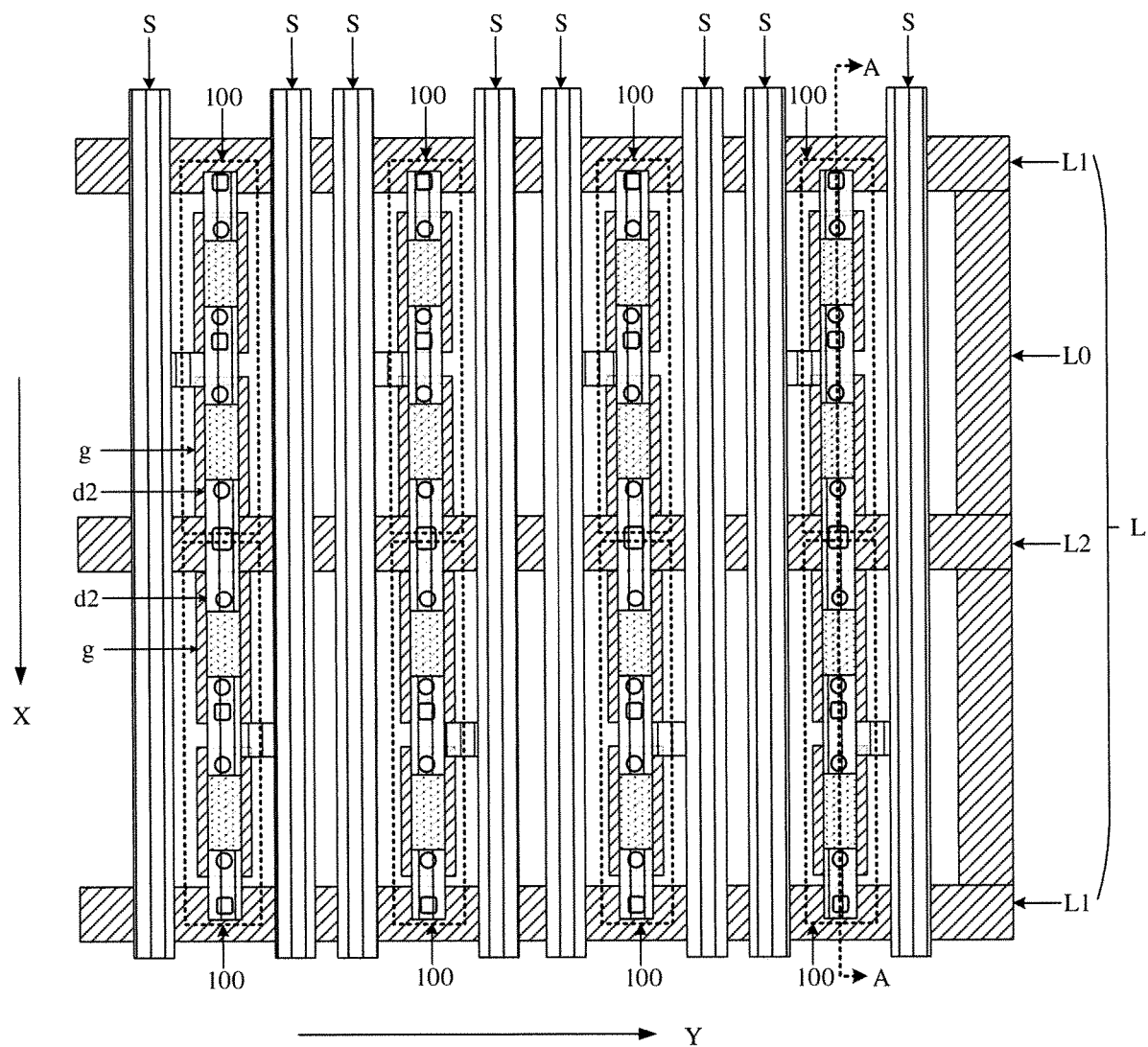
FIG. 11 is a schematic structural diagram of another array substrate according to an embodiment of the present disclosure.

FIG. 11 is a schematic structural diagram of another array substrate according to an embodiment of the present disclosure. As shown in FIG. 11, the signal line S may be a data line extending along a first direction X, and the array substrate includes a plurality of data lines S. The electrostatic protection line L may include three discharge lines which extend along a second direction Y and are parallel to one another, and a connection line L0 for connecting the three discharge lines. The second direction Y may intersect the first direction X and the connection line L0 may extend along the first direction X. For example, the second direction Y may be perpendicular to the first direction X.

As shown in FIG. 11, in the plurality of data lines S, the electrostatic protection circuit 100 connected to each data line S and the electrostatic protection circuit 100 connected to the adjacent data line S may be located in the same column. That is, two electrostatic protection circuits 100 respectively connected to each two adjacent data lines S are disposed between these two data lines S, or no electrostatic protection circuit is disposed between each two adjacent data lines S.

Exemplarily, in the structure shown in FIG. 11, in the order from left to right, the electrostatic protection circuit 100 connected to a first data line S and the electrostatic protection circuit 100 connected to a second data line S are located in the same column, namely, between these two data lines S. The electrostatic protection circuit connected to a third data line S and the electrostatic protection circuit connected to a fourth data line S are also located between these two data lines.

The space occupied by each electrostatic protection circuit can be effectively reduced by disposing the electrostatic protection circuit 100 connected to each data line S and the electrostatic protection circuit 100 connected to the adjacent data line S in the same column, thereby facilitating achievement of a display panel with a narrow frame.

Figure 12:
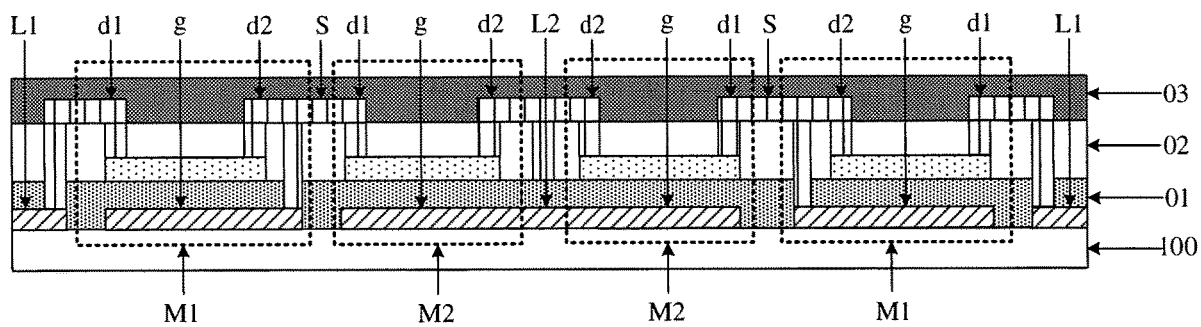
FIG. 12 is a sectional view of FIG. 11 along the direction AA.

FIG. 12 is a sectional view of FIG. 11 along the direction AA. With reference to FIGS. 11 and 12, it can further be seen that in the two electrostatic protection circuits 100 in the same column, one electrostatic protection circuit 100 may be located between a first discharge line and a second discharge line among the three discharge lines, and the other electrostatic protection circuit 100 may be located between the second discharge line and a third discharge line among the three discharge lines. In addition, the gates g and the second electrodes d2 of the second thin film transistors in these two electrostatic protection circuits 100 are all connected to the second discharge line (i.e., the discharge line in the middle).

That is, as shown in FIGS. 11 and 12, the first discharge line and the second discharge line may be used as the first discharge line L1 and the second discharge line L2 of one electrostatic protection circuit, respectively. The third discharge line and the second discharge line may be used as the first discharge line L1 and the second discharge line L2 of the other electrostatic protection circuit, respectively.

Optionally, with reference to FIGS. 11 and 12, it can further be seen that as the gates g of the second thin film transistors M2 in the two electrostatic protection circuits in the same column are connected to the second discharge line L2, the gates g of these two second thin film transistors M2 and the second discharge line L2 may adopt an integral structure, namely, may be manufactured through the one-time patterning process. Thus, the space occupied by the electrostatic protection circuit can be effectively reduced and the manufacturing process of the electrostatic protection circuit can be simplified.

Figure 13:
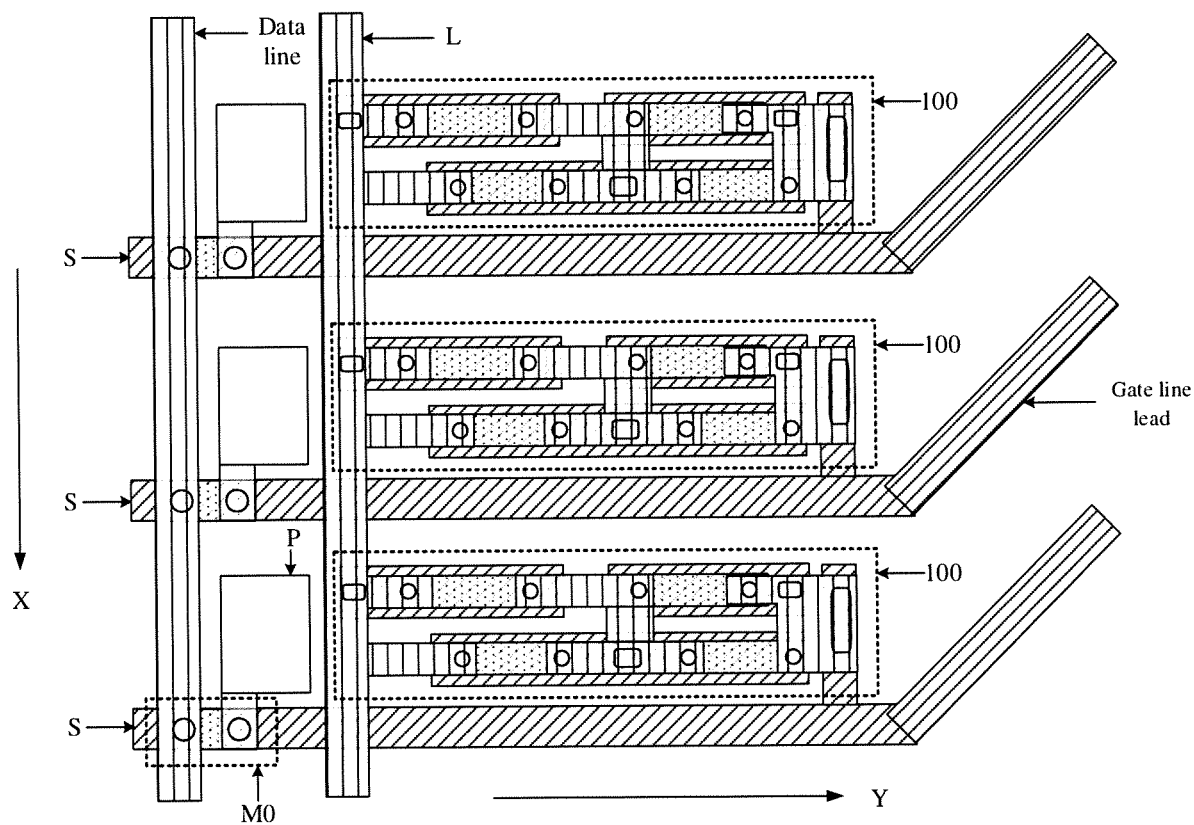
FIG. 13 is a schematic structural diagram of yet another array substrate according to an embodiment of the present disclosure.

FIG. 13 is a schematic structural diagram of yet another array substrate according to an embodiment of the present disclosure. As shown in FIG. 13, the signal line S may be a gate line extending along a second direction Y, and the array substrate includes a plurality of gate lines. The electrostatic protection line L may extend along the first direction X, and the second direction Y intersects the first direction X. Exemplarily, as shown in FIG. 13, the electrostatic protection line L may be parallel to the data line in the array substrate. The second direction Y is perpendicular to the first direction X.

As shown in FIG. 13, an electrostatic protection circuit 100 connected to one of each two adjacent gate lines S of the plurality of gate lines S may be disposed between these two gate lines S.

With reference to FIG. 13, it can further be seen that the electrostatic protection circuits 100 connected to the various gate lines S are located in the non-display region at the periphery of the array substrate, and each gate line S is connected to a gate line lead. A plurality of pixel units arranged in an array are disposed in a display region of the array substrate. Each pixel unit may include a driving transistor M0 and a pixel electrode P connected to the driving transistor M0. It can be seen from FIG. 13 that for each driving transistor M0, the gate is connected to the gate line, the first electrode is connected to the data line and the second electrode is connected to the pixel electrode P. Each driving transistor M0 may provide a driving voltage or a driving current for the pixel electrode P under drive of the gate line and the data line.

Since a width-height ratio of each pixel unit is generally 1:3, wherein the width direction refers to the second direction Y, and the height direction refers to the first direction X. In the array substrate, spacing between the gate lines S, which extend along the second direction Y and are arranged along the first direction X, is relatively large, and thus one electrostatic protection circuit 100 may be disposed between each two adjacent gate lines S. Spacing between the data lines, which extend along the first direction X and are arranged along the second direction Y, is relatively small, and thus two electrostatic protection circuits 100 arranged along the first direction X may be disposed between two adjacent data lines. Thus, reasonable layout of the electrostatic protection circuits is realized and the space occupied by the electrostatic protection circuits is reduced.

Figure 14:
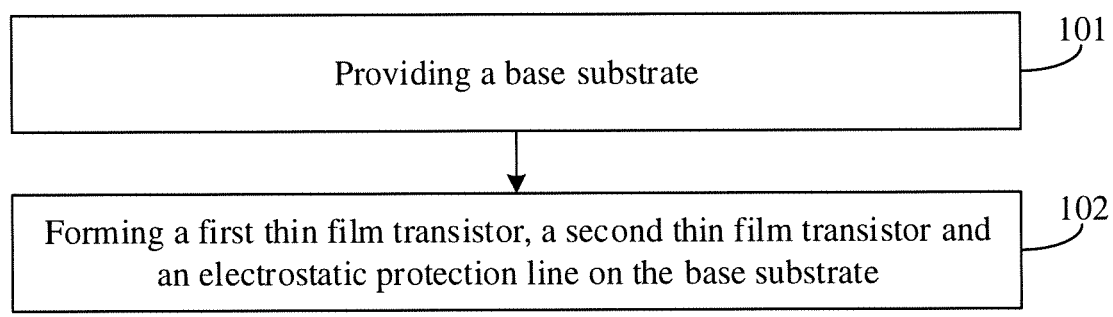
FIG. 14 is a flow chart of a method for manufacturing an electrostatic protection circuit according to an embodiment of the present disclosure.

An embodiment of the present disclosure further provides a manufacturing method of an electrostatic protection circuit. This method may be applied to manufacture the electrostatic protection circuits according to the above embodiments. As shown in FIG. 14, the method may include the following steps.

In step 101, a base substrate is provided.

In step 102, a first thin film transistor, a second thin film transistor and an electrostatic protection line are formed on the base substrate.

A gate and a second electrode of the first thin film transistor are connected to a signal line, and a first electrode of the first thin film transistor is connected to the electrostatic protection line. A gate and a second electrode of the second thin film transistor are connected to the electrostatic protection line, and a first electrode of the second thin film transistor is connected to the signal line.

Each thin film transistor is an oxide thin film transistor, a length-width ratio of a channel of each thin film transistor is greater than or equal to a length-width ratio threshold, and the length-width ratio threshold is greater than 1. Exemplarily, the length-width ratio threshold may be 5.

Optionally, a length direction of the channel of each thin film transistor is parallel to an extension direction of the signal line.

It should be noted that the electrostatic protection circuit according to the embodiments of the present disclosure may be formed in the non-display region at the periphery of the base substrate and may be formed together with the signal line and pixel units, which are located in the display region.

Optionally, in step 102 above, while the first thin film transistor and the second thin film transistor are formed, at least one of a third thin film transistor and a fourth thin film transistor may also be formed on the base substrate.

A gate and a second electrode of the third thin film transistor are connected to the first electrode of the first thin film transistor, and a first electrode of the third thin film transistor is connected to the electrostatic protection line. A gate and a second electrode of the fourth thin film transistor are connected to the first electrode of the first thin film transistor, and a first electrode of the fourth thin film transistor is connected to the signal line.

Optionally, the gate of each thin film transistor formed in step 102 above may be of a strip-shaped structure and a length direction of the strip-shaped structure is parallel to the extension direction of the signal line. In addition, an arrangement direction of the first thin film transistor and the second thin film transistor may be parallel to the extension direction of the signal line.

As an optional implementation, the signal line may be a data line extending along a first direction. The electrostatic protection line may include a first discharge line and a second discharge line which extend along a second direction and are parallel to each other, and a connection line for connecting the first discharge line with the second discharge line. The first direction intersects the second direction.

Correspondingly, the first thin film transistor and the second thin film transistor may be formed between the first discharge line and the second discharge line. In addition, the first electrode of the first thin film transistor is connected to the first discharge line, and the gate and the second electrode of the second thin film transistor are connected to the second discharge line.

Optionally, the second electrode of the first thin film transistor and the first electrode of the second thin film transistor may adopt an integral structure formed through a one-time patterning process and the gate of the first thin film transistor may be connected to the integral structure through a via.

As another optional implementation, the signal line may be a gate line extending along a second direction, and the electrostatic protection line extends along the first direction.

If the third thin film transistor and the fourth thin film transistor are also formed on the base substrate in step 102 above, the first thin film transistor and the second thin film transistor may be arranged along a first axis, and the third thin film transistor and the fourth thin film transistor may be arranged along a second axis. The first axis and the second axis intersect the first direction and are not collinear. For example, the first axis and the second axis may be parallel to the second direction.

Optionally, the first electrode of the first thin film transistor, the first electrode of the second thin film transistor, the second electrode of the third thin film transistor and the second electrode of the fourth thin film transistor may adopt an integral structure formed through the one-time patterning process. The gate of the third thin film transistor and the gate of the fourth thin film transistor may be connected to the integral structure through vias respectively. The gates of the third thin film transistor and the fourth thin film may adopt an integral structure formed through the one-time patterning process.

Optionally, in the embodiments of the present disclosure, the second direction may be perpendicular to the first direction.

The manufacturing method of the electrostatic protection circuit according to the embodiments of the present disclosure will be introduced by taking the electrostatic protection circuit shown in FIGS. 1 and 5 as an example, wherein the thin film transistors in the electrostatic protection circuit are of a bottom-gate structure. The method may include the following steps.

In step S1a, a layer of gate metal thin film is formed on a base substrate.

The base substrate may be a transparent glass substrate. The gate metal thin film may be prepared by magnetron sputtering, evaporation or other methods. The gate metal thin film may be a film layer made of a low-resistance metal material, such as a single-layer metal thin film made of molybdenum (Mo), aluminum (Al), aluminum-nickel alloy, chromium (Cr), copper (Cu), titanium (Ti), AlNd or the like, or a multilayer metal thin film made of Mo/Al/Mo, Ti/Al/Ti or the like.

In step S2a, the gate metal thin film is patterned to form a gate pattern.

Optionally, the gate metal thin film may be patterned with a first mask through a photoetching process to form the gate pattern. The gate pattern may include gates of various thin film transistors and an electrostatic protection line in the electrostatic protection circuit. Of course, since the electrostatic protection circuit may be formed simultaneously with the pixel units in the display region, the gate pattern may further include gate lines and gates of various driving transistors. The photoetching process may include photoresist coating, exposure, development, etching, photoresist stripping and the like.

Figure 15:
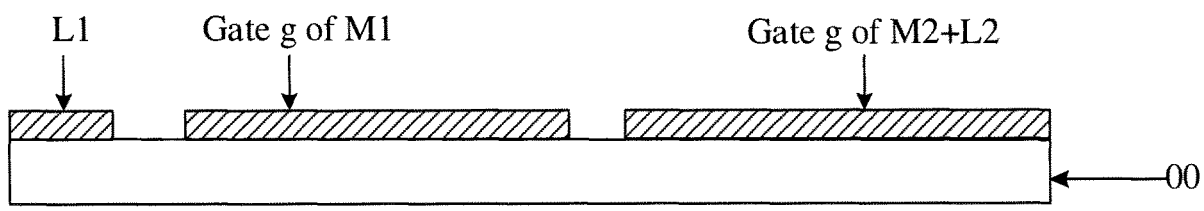
FIG. 15 is a schematic structural diagram of a gate pattern according to an embodiment of the present disclosure.

Exemplarily, as shown in FIG. 15, the gate pattern formed in the non-display region of the base substrate may include a gate g of a first thin film transistor M1, a gate g of a second thin film transistor M2, a first discharge line L1, a second discharge line L2, and a connection line L0 (not shown in the figure). The gate g of M2 and the second discharge line L2 may adopt an integral structure.

In step S3a, a gate insulation layer, an active layer and an etch stop layer are sequentially formed on the base substrate on which the gate pattern is formed.

Figure 16:
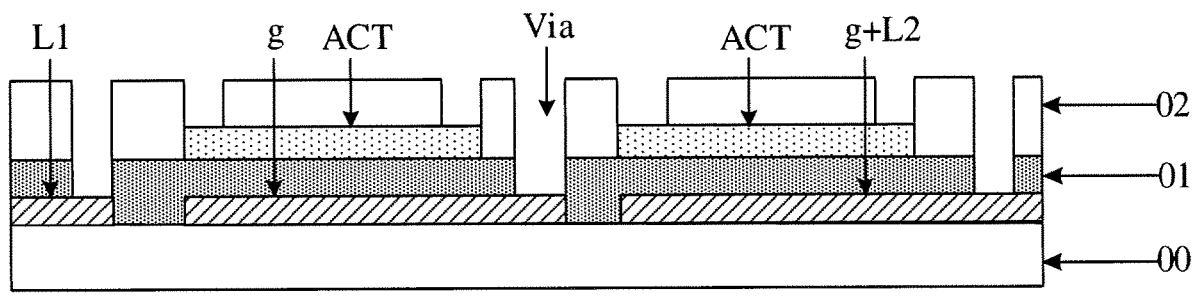
FIG. 16 is a schematic structural diagram of a gate insulation layer, an active layer, and an etch stop layer according to an embodiment of the present disclosure.

The base substrate on which the gate insulation layer 01, the active layer ACT and the etch stop layer 02 are formed may be as shown in FIG. 16. The gate insulation layer may be made of an oxide insulation material, such as silicon oxide, silicon nitride, silicon oxynitride, or aluminium oxide. The active layer may be made of oxide semiconductor material. The etch stop layer may be made of a silicon oxide (SiOx) material.

With reference to FIG. 16, it can further be seen that after the etch stop layer 02 is formed, a plurality of vias may further be formed in the base substrate. Part of the plurality of vias may expose the gate pattern for connecting the gate pattern and a source-drain metal pattern, and part of the plurality of vias may expose the active layer for connecting the active layer and the source-drain metal pattern.

In step S4a, a source-drain metal thin film is formed on the base substrate on which the etch stop layer is formed.

The source-drain metal thin film may be formed by the same material and process as the gate metal thin film, and will not be repeated here.

In step S5a, the source-drain metal thin film is patterned to form the source-drain metal pattern.

Optionally, the source-drain metal thin film may be patterned with a second mask through the photoetching process to obtain the source-drain metal pattern. The source-drain metal pattern may include first electrodes and second electrodes of the various thin film transistors. Since the electrostatic protection circuit may be formed simultaneously with the pixel units in the display region, the source-drain metal pattern may further include data lines, and first electrodes and second electrode of the various driving transistors.

Figure 17:
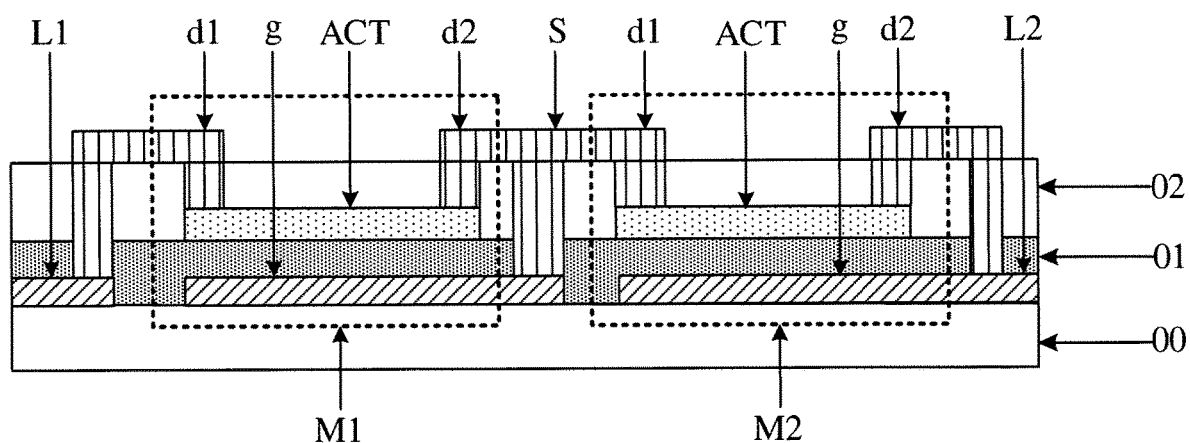
FIG. 17 is a schematic structural diagram of a source-drain metal pattern according to an embodiment of the present disclosure.

Exemplarily, as shown in FIG. 17, the source-drain metal pattern formed in the non-display region of the base substrate may include the first electrode d1 and the second electrode d2 of the first thin film transistor M1, the first electrode d1 and the second electrode d2 of the second thin film transistor M2, and a data line S. The second electrode d2 of M1, the first electrode d1 of M2 and the data line S may adopt an integral structure.

In step S6a, a passivation layer is formed on the base substrate on which the source-drain metal pattern is formed.

Optionally, a passivation protection film may be made of insulation material, and then a pattern of the passivation protection film may be defined with a third mask to form the passivation layer. With reference to FIG. 5, the passivation layer 03 may completely cover the source-drain metal pattern in the non-display region of the base substrate, but partially cover the source-drain metal pattern in the display region of the base substrate. That is, a via for connecting the pixel electrode and a drain of the driving transistor is formed in the passivation layer 03.

Thus, the manufacturing of the electrostatic protection circuit is completed. Further, for the display region of the base substrate, it also needs to continue to form a layer of transparent conductive thin film on the passivation layer, and then the pixel electrode is formed with a fourth mask. The pixel electrode may be connected to the drain of the driving transistor through the via in the passivation layer.

In the corrosion (i.e., etching) procedure of the above process, different corrosion methods, corrosion solutions and corrosion gases are needed to ensure control of a selection proportion, a profile angle and a critical dimension (CD) of different materials. For example, in the procedure of forming the source-drain metal pattern, the gate insulation layer and the active layer may be removed with a similar method, i.e., plasma etching or reactive ion etching. A plurality of layers of thin films may be corroded in the same equipment by adjusting etching gases and etching conditions. For example, the above different thin films may be corroded in the same equipment by selecting different combinations of corrosion gases from sulfur hexafluoride, chlorine, oxygen, helium and like, and different gas flows. For example, a semiconductor thin film can be etched with sulfur hexafluoride, chlorine and helium; an insulation thin film can be etched with hexafluoride, oxygen and helium; and a metal thin film can be etched with chlorine and oxygen.

In order to achieve optimization of a device structure and high efficiency of processes, different thin films have different corrosion conditions, such as different plasma power, gas pressure and electrode spacing. The semiconductor thin film is generally corroded in a plasma chamber with a relatively low gas pressure and higher power to ensure relatively high ion bombardment and sputtering corrosion effects. The insulation thin film and the metal thin film are generally corroded in a plasma chamber with a relatively high gas pressure and slightly low power to ensure a relatively high chemical reactive ion corrosion effect. For example, sulfur hexafluoride of the volume flow rate of tens of sccm and chlorine of the volume flow rate of thousands of sccm is introduced into a device. Thus, the semiconductor thin film can be removed efficiently by etching in the environment with the power above thousands of kilowatts and the gas pressure of tens of millitorrs. For another example, sulfur hexafluoride of the volume flow rate of hundreds of sccm and chlorine of the volume flow rate of hundreds of sccm is introduced into a device. Thus, the insulation thin film can be removed efficiently by etching in the environment with the power below several kilowatts and the gas pressure of hundreds of millitorrs.

For another example, in the process of forming the source-drain metal pattern, the source-drain metal film may be removed by etching with a chemical erosion solution based on the material of the source-drain metal material, or may be removed by the plasma etching or reactive ion etching method. For example, chlorine of the volume flow rate from hundreds of sccm to thousands of sccm, and oxygen of the volume flow rate of thousands of sccm is introduced into a dry etching device. Thus, the metal thin film can be efficiently removed by etching in the environment with the power below several kilowatts and the gas pressure of hundreds of millitorrs. When the gate pattern and the active layer are formed, the source-drain metal thin film and the doped semiconductor layer are removed by continuous corrosion in the same device by using the plasma etching or reactive ion etching method under the conditions described above. Wet etching may be used to remove the metal thin film and is generally performed by immersion and spraying of a mixed solution with certain concentration ratio of nitric acid, hydrochloric acid, and acetic acid at the temperature of tens of degrees.

The manufacturing method of the electrostatic protection circuit according to the embodiments of the present disclosure will be introduced by taking the electrostatic protection circuit shown in FIGS. 1 and 5 as an example, wherein the thin film transistor in the electrostatic protection circuit is of a top-gate structure. The method may include the following steps.

In step S1b, a buffer layer is formed on a base substrate.

Exemplarily, a silicon nitride (SiN) thin film and a silicon dioxide (SiO2) thin film may be sequentially deposited on the entire base substrate by plasma enhanced chemical vapor deposition (PECVD) to obtain the buffer layer.

In step S2b, an active layer is formed on the base substrate on which the buffer layer is formed.

Optionally, an oxide semiconductor thin film may be deposited on the surface of the base substrate by sputtering, thermal evaporation, PECVD, low-pressure chemical vapor deposition (LPCVD), atmospheric pressure chemical vapor deposition (APCVD), electron cyclotron resonance chemical vapor deposition (ECR-CVD), or the like, and the oxide semiconductor thin film is patterned to obtain the active layer. For example, the oxide semiconductor thin film may be patterned by photoetching and etching processes. For the etching process, wet etching is generally adopted and the used etching solution may be sulfuric acid ($H_2SO_4$), phosphoric acid ($H_3PO_4$), or hydrogen peroxide ($H_2O_2$). Different etching solutions may be selected according to the oxide semiconductor material of the active layer and the material of the source-drain metal thin film.

Further, an etch stop layer may also be deposited on the surface of the active layer by PECVD, LPCVD, APCVD, ECR-CVD or the sputtering process. Since the oxide semiconductor material, such as IGZO, has an extremely high corrosion rate in the traditional etching solution for etching a source-drain metal pattern, and the oxide semiconductor is relatively sensitive to water and oxygen, the etch stop layer needs to be added on the active layer in order to protect the active layer.

The material for forming the oxide semiconductor thin film may be amorphous or polycrystalline metal oxide semiconductor material. The amorphous or polycrystalline metal oxide semiconductor material may include one or more of indium (In), gallium (Ga), zinc (Zn), hafnium (Hf), tin (Sn), Al and other metal elements. Exemplarily, the oxide semiconductor material may be ZnO, InZnO (IZO), ZnSnO (ZTO), InSnZnO (ITZO), GaZnO (GZO), InGaZnO (IGZO), HfInZnO (HIZO), SnInO (ITO), AlInZnO (AIZO), or the like. Or the material for forming the oxide semiconductor thin film may also be a material formed by doping the above metal oxide semiconductor material with one or more metal ions or non-metal ions, such as ZnO:Ga (that is, ZnO is doped with Ga ions), ZnO:Li, IGZO:Li, IGZO:N, or ZnON.

Optionally, the oxide semiconductor thin film may have a thickness of 40 nm to 50 nm, and have oxygen content of 15% to 30% during deposition.

In step S3b, a gate insulation layer is formed on the base substrate on which the active layer is formed.

Further, the photoresist on the polysilicon active layer may be removed by a photoresist stripping process, and a $SiO_2$ thin film or a composite thin film of $SiO_2$ and SiN is deposited by PECVD, to form the gate insulation layer on the active layer and the entire buffer layer.

In step S4b, a gate metal pattern is formed on the base substrate on which the gate insulation layer is formed.

In the embodiments of the present disclosure, a thin film made of one or more low-resistance metal materials may be deposited on the gate insulation layer by physical vapor deposition methods, such as magnetron sputtering. The gate metal pattern is formed by the photoetching process. The gate metal pattern may include gates of various thin film transistors and the gate lines. The gate metal thin film may be a single-layer metal thin film made of Al, Cu, Mo, Ti, AlNd or the like, or a multilayer metal thin film made of Mo/Al/Mo, Ti/Al/Ti or the like.

In step S4b, an interlayer insulation layer is formed on the base substrate on which the gate metal pattern is formed.

Further, a $SiO_2$ thin film and a SiN thin film may be sequentially deposited, by PECVD, on the entire surface of the base substrate, on which the gate metal pattern is formed to form the interlayer insulation layer, and the interlayer insulation layer is etched by a mask and the etching process to form first contact holes and second contact holes.

In step S5b, a source-drain metal pattern is formed on the base substrate on which the interlayer insulation layer is formed.

A source-drain metal thin film containing one or more low-resistance materials may be deposited on the interlayer insulation layer by the magnetron sputtering process, and the source-drain metal pattern is formed by a mask and the etching process. The source-drain metal pattern may include first electrodes and second electrodes of the various thin film transistors and the data lines. The first electrodes may contact the active layer through the first contact holes, and the second electrodes may contact the active layer through the second contact holes.

The material for forming the source-drain metal thin film may include any one of molybdenum, molybdenum-niobium alloy, aluminum, aluminum-neodymium alloy, titanium and copper. The source-drain metal thin film may have a thickness of 20 nm to 30 nm. It should be noted here that the source-drain metal thin film may be a single-layer metal film, a double-layer metal film of buffer metal/metal, or a three-layer metal film of buffer metal/metal/buffer metal.

Further, the base substrate after the above steps may be annealed at an annealing temperature of 30-320° C. for 30 minutes (min). In this step, metal atoms in the metal materials of the first electrodes and the second electrodes of the transistors can diffuse to the active layer to chemically react with oxygen atoms in the oxide semiconductor material for forming the active layer, so that the material of the active layer at this location loses oxygen, that is, the number of oxygen vacancies increases. At the same time, free electrons also increase accordingly, such that the semiconductor material at this location presents a metallization (semiconductor) trend. Hence, the ohmic contact between the first electrodes and the second electrodes of the transistors and the active layer can be increased. In addition, the stability of the channel region of the active layer can be enhanced, such that the oxide thin film transistor has better performance.

In step S6b, a passivation layer is formed on the base substrate on which the source-drain metal pattern is formed.

Finally, a layer of SiN thin film may be deposited, by PECVD, on the entire surface of the base substrate on which the source-drain metal pattern is formed, and then the passivation layer containing vias is formed by a mask and the etching process. Afterwards, a hydrogenation process is performed by rapid thermal annealing or annealing through a thermal treatment furnace to repair defects in the polysilicon active layer and on the interface. The vias may be via holes for connecting the second electrode of the driving transistor and the pixel electrode, located in the display region of the base substrate. Thus, the manufacturing of the electrostatic protection circuit is completed.

Further, for the display region of the base substrate, an organic planarization layer, having the same vias as those in the passivation layer, may be formed on the passivation layer by a mask process again, to fill the recesses on the surface of the device surface to form a flat surface. Then, a layer of transparent conductive thin film is deposited on the organic planarization layer and the vias by magnetron sputtering, and then is etched by the photoetching process, thereby forming the pixel electrodes of the pixel region on the vias and part of the organic planarization layer. Afterwards, a layer of photosensitive organic material similar to the material of the organic planarization layer is coated on the organic planarization layer and the pixel electrodes, and then part of a pixel electrode region is exposed by a mask process to form a pixel definition layer. The pixel definition layer covers the organic planarization layer and part of the pixel electrode region. The transparent conductive thin film may be a single-layer oxide conductive thin film, such as ITO (indium tin oxide) or IZO (indium zinc oxide), or a composite thin film such as ITO (indium tin oxide)/Ag/ITO, IZO (indium zinc oxide)/Ag.

An embodiment of the present disclosure further provides a display apparatus. The display apparatus may include the array substrate as shown in any of FIGS. 10-13. The display apparatus may be any product or component having a display function, such as a liquid crystal panel, a piece of electronic paper, an OLED panel, an AMOLED panel, a mobile phone, a tablet computer, a television, a display, a laptop computer, a digital photo frame and a navigator.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. An electrostatic protection circuit, comprising a first thin film transistor, a second thin film transistor and an electrostatic protection line, wherein
a gate and a second electrode of the first thin film transistor are connected to a signal line, and a first electrode of the first thin film transistor is connected to the electrostatic protection line; and
a gate and a second electrode of the second thin film transistor are connected to the electrostatic protection line, and a first electrode of the second thin film transistor is connected to the signal line;
wherein the signal line is a data line extending along a first direction; the electrostatic protection line comprises: a first discharge line and a second discharge line which extend along a second direction and are parallel to each other, and a connection line for connecting the first discharge line and the second discharge line; the first direction intersecting the second direction; and the first thin film transistor and the second thin film transistor are disposed between the first discharge line and the second discharge line, the first electrode of the first thin film transistor is connected to the first discharge line, and the gate and the second electrode of the second thin film transistor are connected to the second discharge line; or
wherein the signal line is a gate line extending along a second direction; and the electrostatic protection line extends along a first direction, and the second direction intersects the first direction; and the electrostatic protection circuit further comprises: a third thin film transistor and a fourth thin film transistor; wherein a gate and a second electrode of the third thin film transistor are connected to the first electrode of the first thin film transistor and a first electrode of the third thin film transistor is connected to the electrostatic protection line; a gate and a second electrode of the fourth thin film transistor are connected to the first electrode of the first thin film transistor and a first electrode of the fourth thin film transistor is connected to the signal line; and the first thin film transistor and the second thin film transistor are arranged along a first axis, the third thin film transistor and the fourth thin film transistor are arranged along a second axis, and the first axis and the second axis intersect the first direction and are not collinear;

wherein each thin film transistor is an oxide thin film transistor, a length-width ratio of a channel of each thin film transistor is greater than or equal to a length-width ratio threshold, and the length-width ratio threshold is 5.

2. The electrostatic protection circuit according to claim 1, wherein a length direction of the channel of each thin film transistor is parallel to an extension direction of the signal line.

3. The electrostatic protection circuit according to claim 1, wherein
the gate of each thin film transistor is of a strip-shaped structure and a length direction of the strip-shaped structure is parallel to an extension direction of the signal line.

4. The electrostatic protection circuit according to claim 1, wherein
an arrangement direction of the first thin film transistor and the second thin film transistor is parallel to an extension direction of the signal line.

5. The electrostatic protection circuit according to claim 1, wherein the second electrode of the first thin film transistor and the first electrode of the second thin film transistor are of an integral structure, and the gate of the first thin film transistor is connected to the integral structure through a via.

6. The electrostatic protection circuit according to claim 5, further comprising: at least one of a third thin film transistor and a fourth thin film transistor; wherein
a gate and a second electrode of the third thin film transistor are connected to the first electrode of the first thin film transistor, and a first electrode of the third thin film transistor is connected to the electrostatic protection line; a gate and a second electrode of the fourth thin film transistor are connected to the first electrode of the first thin film transistor, and a first electrode of the fourth thin film transistor is connected to the signal line; and
the channel of each thin film transistor is S-shaped, zigzag or arc-shaped, the gate of each thin film transistor is of a strip-shaped structure; a length direction of the channel of each thin film transistor, a length direction of the strip-shaped structure, and an arrangement direction of the first thin film transistor and the second thin film transistor are all parallel to the first direction, and the second direction is perpendicular to the first direction.

7. The electrostatic protection circuit according to claim 1, wherein the first axis and the second axis are parallel to the second direction.

8. The electrostatic protection circuit according to claim 1, wherein
the first electrode of the first thin film transistor, the first electrode of the second thin film transistor, the second electrode of the third thin film transistor and the second electrode of the fourth thin film transistor are of an integral structure; and the gate of the third thin film transistor and the gate of the fourth thin film transistor are connected to the integral structure through vias.

9. The electrostatic protection circuit according to claim 1, wherein
the gate of the third thin film transistor and the gate of the fourth thin film are of an integral structure.

10. The electrostatic protection circuit according to claim 1, wherein the first axis and the second axis are parallel to the second direction;
the first electrode of the first thin film transistor, the first electrode of the second thin film transistor, the second electrode of the third thin film transistor, and the second electrode of the fourth thin film transistor are of an integral structure, and the gate of the third thin film transistor and the gate of the fourth thin film transistor are connected to the integral structure through a via; and the gate of the third thin film transistor and the gate of the fourth thin film transistor are of an integral structure;
the channel of each thin film transistor is S-shaped, zigzag or arc-shaped, the gate of each thin film transistor is of a strip-shaped structure, a length direction of the channel of each thin film transistor, a length direction of the strip-shaped structure, and an arrangement direction of the first thin film transistor and the second thin film transistor are all parallel to the first direction, and the second direction is perpendicular to the first direction.

11. The electrostatic protection circuit according to claim 1, wherein the second direction is perpendicular to the first direction.

12. An array substrate, comprising:
a signal line, and an electrostatic protection circuit connected to the signal line; the electrostatic protection circuit comprising a first thin film transistor, a second thin film transistor and an electrostatic protection line, wherein
a gate and a second electrode of the first thin film transistor are connected to the signal line, and a first electrode of the first thin film transistor is connected to the electrostatic protection line; and
a gate and a second electrode of the second thin film transistor are connected to the electrostatic protection line, and a first electrode of the second thin film transistor is connected to the signal line;
wherein the signal line is a data line extending along a first direction; the electrostatic protection line comprises: a first discharge line and a second discharge line which extend along a second direction and are parallel to each other, and a connection line for connecting the first discharge line and the second discharge line; the first direction intersecting the second direction; and the first thin film transistor and the second thin film transistor are disposed between the first discharge line and the second discharge line, the first electrode of the first thin film transistor is connected to the first discharge line, and the gate and the second electrode of the second thin film transistor are connected to the second discharge line; or
wherein the signal line is a gate line extending along a second direction; and the electrostatic protection line extends along a first direction, and the second direction intersects the first direction; and the electrostatic protection circuit further comprises: a third thin film transistor and a fourth thin film transistor; wherein a gate and a second electrode of the third thin film transistor are connected to the first electrode of the first thin film transistor and a first electrode of the third thin film transistor is connected to the electrostatic protection line; a gate and a second electrode of the fourth thin film transistor are connected to the first electrode of the first thin film transistor and a first electrode of the fourth thin film transistor is connected to the signal line; and the first thin film transistor and the second thin film transistor are arranged along a first axis, the third thin film transistor and the fourth thin film transistor are arranged along a second axis, and the first axis and the second axis intersect the first direction and are not collinear;

wherein each thin film transistor is an oxide thin film transistor, a length-width ratio of a channel of each thin film transistor is greater than or equal to a length-width ratio threshold, and the length-width ratio threshold is 5.

13. The array substrate according to claim 12, wherein the signal line is the data line extending along a first direction, and the array substrate comprises a plurality of data lines; the electrostatic protection line further comprises: a third discharge line which extend along a second direction and are parallel to the first discharge line and the second discharge line, and a connection line for connecting the three discharge lines; the second direction intersecting the first direction;
    an electrostatic protection circuit connected to each data line and an electrostatic protection circuit connected to an adjacent data line are in the same column;
    in the two electrostatic protection circuits in the same column, one electrostatic protection circuit is between the first discharge line and the second discharge line among the three discharge lines, and the other electrostatic protection circuit is between the second discharge line and a third discharge line among the three discharge lines; and gates and second electrodes of second thin film transistors in the two electrostatic protection circuits in the same column are connected to the second discharge line.

14. The array substrate according to claim 12, wherein the signal line is the gate line extending along a second direction and the array substrate comprises a plurality of gate lines; the electrostatic protection line extends along the first direction, and the second direction is perpendicular to the first direction; and
    an electrostatic protection circuit connected to one of each of the plurality of gate lines is disposed between the two adjacent gate lines.

15. A display apparatus, comprising the array substrate according to claim 12.

16. A method for manufacturing an electrostatic protection circuit, comprising:
    providing a base substrate; and
    forming a first thin film transistor, a second thin film transistor and an electrostatic protection line on the base substrate;
    wherein, a gate and a second electrode of the first thin film transistor are connected to a signal line, and a first electrode of the first thin film transistor is connected to the electrostatic protection line; and
    a gate and a second electrode of the second thin film transistor are connected to the electrostatic protection line, and a first electrode of the second thin film transistor is connected to the signal line;
    wherein the signal line is a data line extending along a first direction; the electrostatic protection line comprises: a first discharge line and a second discharge line which extend along a second direction and are parallel to each other, and a connection line for connecting the first discharge line and the second discharge line; the first direction intersecting the second direction; and the first thin film transistor and the second thin film transistor are disposed between the first discharge line and the second discharge line, the first electrode of the first thin film transistor is connected to the first discharge line, and the gate and the second electrode of the second thin film transistor are connected to the second discharge line; or
    wherein the signal line is a gate line extending along a second direction; and the electrostatic protection line extends along a first direction, and the second direction intersects the first direction; and the electrostatic protection circuit further comprises: a third thin film transistor and a fourth thin film transistor; wherein a gate and a second electrode of the third thin film transistor are connected to the first electrode of the first thin film transistor and a first electrode of the third thin film transistor is connected to the electrostatic protection line; a gate and a second electrode of the fourth thin film transistor are connected to the first electrode of the first thin film transistor and a first electrode of the fourth thin film transistor is connected to the signal line; and the first thin film transistor and the second thin film transistor are arranged along a first axis, the third thin film transistor and the fourth thin film transistor are arranged along a second axis, and the first axis and the second axis intersect the first direction and are not collinear;
each thin film transistor is an oxide thin film transistor, a length-width ratio of a channel of each thin film transistor is greater than or equal to a length-width ratio threshold, and the length-width ratio threshold is 5.

\* \* \* \* \*